US012622087B2

(12) United States Patent
Yu et al.

(10) Patent No.: US 12,622,087 B2
(45) Date of Patent: May 5, 2026

(54) PHOTOVOLTAIC CELL AND MANUFACTURING METHOD FOR PHOTOVOLTAIC CELL

(71) Applicant: ZHEJIANG JINKO SOLAR CO., LTD., Haining (CN)

(72) Inventors: Kun Yu, Haining (CN); Changming Liu, Haining (CN); Xinyu Zhang, Haining (CN); Pengsong Zhao, Haining (CN); Dong Wang, Haining (CN); Chao Zhou, Haining (CN)

(73) Assignee: ZHEJIANG JINKO SOLAR CO., LTD., Haining (CN)

( * ) Notice: Subject to any disclaimer, the term of this patent is extended or adjusted under 35 U.S.C. 154(b) by 14 days.

(21) Appl. No.: 18/358,052

(22) Filed: Jul. 25, 2023

(65) Prior Publication Data

US 2024/0030371 A1     Jan. 25, 2024

(30) Foreign Application Priority Data

Jul. 25, 2022     (CN) .......................... 202210874050.7

(51) Int. Cl.
H10F 71/00          (2025.01)
H10F 77/1223        (2025.01)
H10F 77/30          (2025.01)

(52) U.S. Cl.
CPC ......... H10F 71/121 (2025.01); H10F 71/129 (2025.01); H10F 77/1223 (2025.01); H10F 77/311 (2025.01)

(58) Field of Classification Search
CPC ............... H10F 77/1223; H10F 77/311; H01L 31/02167; H01L 31/0288; H01L 31/068
See application file for complete search history.

(56) References Cited

U.S. PATENT DOCUMENTS

2009/0014069 A1     1/2009  Chan
2009/0155952 A1*    6/2009  Stan .................... H10F 10/1425
                                                        438/94

(Continued)

FOREIGN PATENT DOCUMENTS

CN          101800261 A      8/2010
CN          102185005 A      9/2011

(Continued)

OTHER PUBLICATIONS

Extended European Search Report issued in corresponding EP Application 23187575.8, issued Nov. 27, 2023, 10 pages.

(Continued)

*Primary Examiner* — Golam Mowla
(74) *Attorney, Agent, or Firm* — Wiersch Law Group

(57)          ABSTRACT

The present disclosure relates to a photovoltaic cell and a method for manufacturing a photovoltaic cell. The photovoltaic cell includes a substrate including an emitter and a passivation layer stacked in sequence on one side of the substrate. The emitter includes a first plane and a second plane laminated along a thickness direction of the emitter, and part of the emitter between the second plane and the first plane is a first doped layer. Within a unit volume, a rate of change $\Delta C_1$ between doping concentration of the second plane and doping concentration of the first plane satisfies: $\Delta C_1 \leq 15\%$.

17 Claims, 4 Drawing Sheets

(56)                   References Cited

U.S. PATENT DOCUMENTS

| 2010/0015749 A1 | 1/2010 | Borden |
| 2014/0357008 A1 | 12/2014 | Kim et al. |
| 2015/0017793 A1* | 1/2015 | Hallam ............... H01L 31/1864 |
| | | 438/540 |
| 2015/0075595 A1 | 3/2015 | Gall |
| 2019/0088802 A1* | 3/2019 | Kang ................... H10F 71/103 |
| 2022/0384664 A1* | 12/2022 | Kim ....................... H10F 77/42 |

FOREIGN PATENT DOCUMENTS

| CN | 103038898 A | 4/2013 |
| CN | 103597602 A | 2/2014 |
| CN | 108899376 A | 11/2018 |
| CN | 113035976 A | 6/2021 |
| CN | 113571604 A | 10/2021 |
| CN | 113764519 A | 12/2021 |
| CN | 113972130 A | 1/2022 |
| CN | 114078977 A | 2/2022 |
| EP | 2293341 A2 | 3/2011 |
| GB | 1127161 A | 9/1968 |
| JP | S59151462 A | 8/1984 |
| KR | 20100123308 A | 11/2010 |
| KR | 20140004828 A | 1/2014 |
| WO | 2009014957 A2 | 1/2009 |
| WO | 2010051784 A2 | 5/2010 |
| WO | 2010104340 A2 | 9/2010 |

OTHER PUBLICATIONS

Deep-Diffusion-of-Phosphorus-in-Silicon-using-Microsecond-pulsed-Laser-Doping.
Kerfless-Epitaxial-Mono-Crystalline-Si-Wafers-With-Built-In-Junction-and-From-Reused-Substrates-for-High-Efficiency-PERx-Cells.
Rapid-Deep-Dopant-Diffusion-in-Crystalline-Silicon-by-Laser-Induced-Surface-Melting.
Notice Of Allowance(CN202210874050.7); Date of Mailing: Sep. 27, 2022.
First Office Action(CN202210874050.7); Date of Mailing: Sep. 13, 2022.
Study-on-fabrication-of-Selective-emitter-cells-by-laser-doping Mechanical translation.
Research-on-doping-and-metallization-for-crystalline-silicon-solar-cells.
Crystalline-Solar-Cells-with-Selective-Emitters.
Patent Search Report; Date of Mailing: Jun. 18, 2022 (12 pages).

* cited by examiner

3

2
15
13

1

4

2
15
13
16
14

1

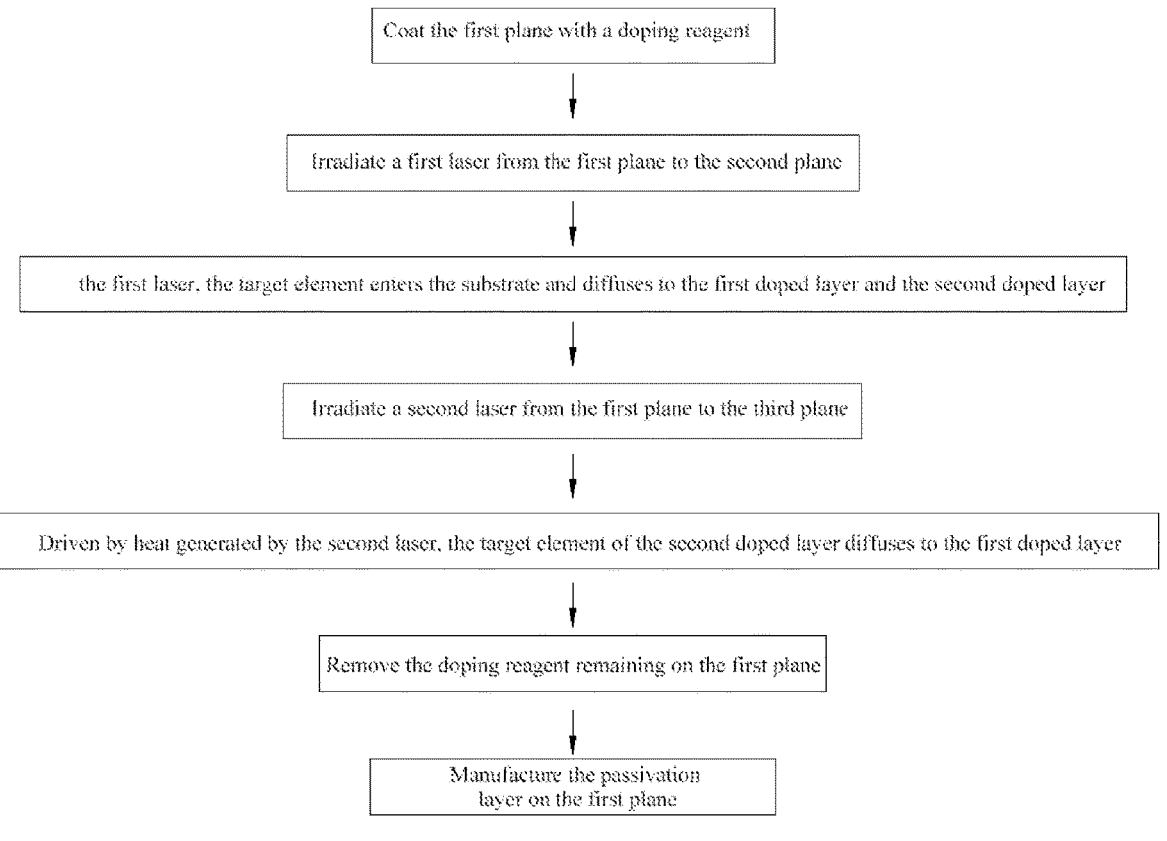

Coat the first plane with a doping reagent

Irradiate a first laser from the first plane to the second plane the first laser, the target element enters the substrate and diffuses to the first doped layer and the second doped layer Irradiate a second laser from the first plane to the third plane Driven by heat generated by the second laser, the target element of the second doped layer diffuses to the first doped layer Remove the doping reagent remaining on the first plane Manufacture the passivation layer on the first plane

FIG. 6

PHOTOVOLTAIC CELL AND MANUFACTURING METHOD FOR PHOTOVOLTAIC CELL

TECHNICAL FIELD

The present disclosure relates to the technical field of photovoltaic cells, and in particular, to a photovoltaic cell and a method for manufacturing a photovoltaic cell.

BACKGROUND

A photovoltaic cell is provided with a selective emitter to improve operation efficiency of the photovoltaic cell. During manufacturing of the selective emitter, a target element is driven into a first doped layer of a semiconductor substrate, and at the same time, the target element is diffused into a deeper second doped layer inside the substrate to realize doping of the semiconductor substrate. In the related art, the substrate is doped with a laser of a single wavelength, or doped by a post-oxidation process, leading to a rapid decrease in doping concentration of the first doped layer along a thickness direction, and making local concentration of the first doped layer lower, thereby reducing electrical properties of the substrate.

SUMMARY

The present disclosure provides a photovoltaic cell, which can reduce a rate of change of doping concentration of a first doped layer.

According to a first aspect of the present disclosure, a photovoltaic cell is provided, including: a substrate including an emitter disposed in the substrate and a passivation layer stacked on a side of the emitter away from the substrate; the emitter including a first plane and a second plane laminated along a thickness direction of the emitter, and part of the emitter between the second plane and the first plane being a first doped layer; and within a unit volume, a rate of change $\Delta C_1$ between doping concentration of the second plane and doping concentration of the first plane satisfying: $\Delta C_1 \leq 15\%$.

In the present disclosure, $\Delta C_1 \leq 15\%$, which reduces a risk of a rapid decrease in doping concentration of the first doped layer along the thickness direction, thereby improving consistency of the doping concentration of the first doped layer, reduces a risk of higher contact resistivity between the emitter and a metal electrode caused by lower local doping concentration of the first doped layer, and facilitates electrical connection between the emitter and the metal electrode, thereby improving conversion efficiency of the photovoltaic cell and improving operation stability of the photovoltaic cell.

In an embodiment, a third plane is provided on a side of the second plane away from the first plane, and part of the emitter between the third plane and the second plane is a second doped layer; and a rate of change $\Delta C_2$ between doping concentration of the third plane and the doping concentration of the second plane satisfies: $\Delta C_2 \leq 30\%$.

In an embodiment, a distance H1 between the second plane and the first plane satisfies: $0.3 \ \mu m \leq H1 \leq 0.35 \ \mu m$; and a distance H2 between the third plane and the first plane satisfies: $0.5 \ \mu m \leq H2 \leq 0.7 \ \mu m$.

In an embodiment, within a unit volume, a rate of change $\Delta C_3$ between doping concentration at a first position of the second plane and doping concentration at a second position of the second plane satisfies: $\Delta C_3 \leq 25\%$.

According to a second aspect of the present disclosure, a method for manufacturing the photovoltaic cell described above is provided, the method including: doping a target element into the substrate to form the emitter; and manufacturing the passivation layer on the first plane of the emitter.

In an embodiment, a third plane is provided on a side of the second plane away from the first plane, and the doping a target element into the substrate includes: coating the first plane with a doping reagent containing the target element; directing a first laser through the doping reagent into the second plane to diffuse the target element to the first doped layer and the second doped layer; and directing a second laser through the doping reagent into the third plane to diffuse the target element of the second doped layer to the first doped layer.

In an embodiment, the directing a first laser through the doping reagent into the second plane to diffuse the target element to the first doped layer and the second doped layer includes: directing the first laser through the doping reagent and the first plane into the second plane, and generating a high temperature; and driving the target element into the first doped layer by the first laser and further driving the target element to diffuse to the second doped layer by the high temperature generated by the first lase.

In an embodiment, the directing a second laser through the doping reagent into the third plane to diffuse the target element of the second doped layer to the first doped layer includes: directing the second laser through the doping reagent, the first plane, and the second plane into the third plane, and generating a high temperature; and driving the target element to diffuse to the first doped layer by the high temperature generated by the second laser.

In an embodiment, a wavelength L1 of the first laser satisfies: $300 \ nm \leq L1 \leq 400 \ nm$, a wavelength L2 of the second laser satisfies: $400 \ nm \leq L2 \leq 550 \ nm$, and $L1 < L2$.

In an embodiment, energy density W1 of the first laser satisfies: $0.4 \ J/cm^2 \leq W1 \leq 1.5 \ J/cm^2$, and energy density W2 of the second laser satisfies: $0.6 \ J/cm^2 \leq W2 \leq 1.8 \ J/cm^2$.

In an embodiment, after doping the target element, the method further includes: removing the doping reagent remaining on the first plane.

It should be understood that the foregoing general description and the following detailed description are exemplary only and are not intended to limit the present disclosure.

BRIEF DESCRIPTION OF DRAWINGS

FIG. 6 is a flowchart of a method for manufacturing a photovoltaic cell according to the present disclosure in one or more embodiments.

REFERENCE SIGNS

1: substrate;
    11: passivation layer;

12: first plane;
13: second plane;
14: third plane;
15: first doped layer;
16: second doped layer;
2: doping reagent;
3: first laser;
4: second laser.

The accompanying drawings herein are incorporated in and constitute a part of this specification, illustrate embodiments consistent with the present disclosure and, together with the specification, serve to explain the principles of the present disclosure.

DESCRIPTION OF EMBODIMENTS

In order to better understand the technical solutions of the present disclosure, embodiments of the present disclosure are described in detail below with reference to the accompanying drawings.

It is to be made clear that the described embodiments are only some rather than all of the embodiments of the present disclosure. All other embodiments obtained by those of ordinary skill in the art based on the embodiments in the present disclosure without creative efforts fall within the protection scope of the present disclosure.

The terms used in the embodiments of the present disclosure are intended only to describe particular embodiments and are not intended to limit the present disclosure. As used in the embodiments of the present disclosure and the appended claims, the singular forms of "a/an", "the", and "said" are intended to include plural forms, unless otherwise clearly specified by the context.

It is to be understood that the term "and/or" used herein is merely an association relationship describing associated objects, indicating that three relationships may exist. For example, A and/or B indicates that there are three cases of A alone, A and B together, and B alone. In addition, the character "/" herein generally means that associated objects before and after it are in an "or" relationship.

It is to be noted that the location terms such as "above", "below", "left", and "right" described in the embodiments of the present disclosure are described with reference to the angles shown in the accompanying drawings, and should not be construed as limitations on the embodiments of the present disclosure. In addition, in the context, it is to be further understood that, when one element is referred to as being connected "above" or "below" another element, the one element may be directly connected "above" or "below" another element, or connected "above" or "below" another element via an intermediate element.

Figure 1:
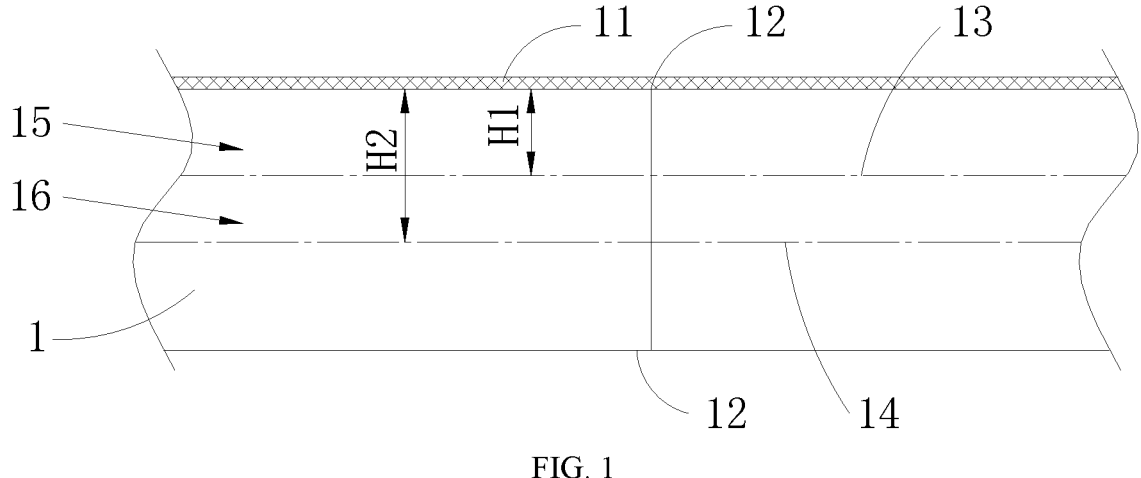
FIG. 1 is a schematic structural diagram of an emitter of a photovoltaic cell according to the present disclosure in one or more embodiments, in which a first plane and a second plane are each provided with a passivation layer.

Some embodiments of the present disclosure provide a photovoltaic cell, including a substrate 1 (the substrate 1 includes, but not limited to, an N-type silicon wafer, a P-type silicon wafer, and the like). As shown in FIG. 1, an emitter and a passivation layer 11 stacked in sequence are included on one side of the substrate 1, the emitter is configured to connect a metal electrode, and the passivation layer 11 keeps the lifetime of effective minority carriers of the photovoltaic cell at a relatively high level, such that the photovoltaic cell obtains a higher open-circuit voltage and a higher short-circuit voltage, which effectively improves output characteristics of the photovoltaic cell, and then improves conversion efficiency of the photovoltaic cell. The substrate 1 may be made of a silicon substrate material, and the silicon substrate material may include one or more of monocrystalline silicon, polycrystalline silicon, amorphous silicon, and microcrystalline silicon. A specific material and a specific type of the substrate 1 are not limited in the present disclosure.

As shown in FIG. 1, the emitter includes a first doped layer 15 and a second doped layer 16 stacked along a thickness direction of the emitter and containing a target element, the first doped layer 15 is part of the emitter between a first plane 12 and a second plane 13, and the second doped layer 16 is part of the emitter between a third plane 14 and the second plane 13. The target element includes, but is not limited to, nitrogen, phosphorus, arsenic, boron, aluminum, gallium, indium, thallium, and the like. If the substrate is an N-type semiconductor, the emitter may be a P-type doped layer. If the substrate is a P-type semiconductor, the emitter may be an N-type doped layer. A specific type of the target element is not limited in the present disclosure. The following descriptions are all based on an example in which the substrate 1 is a semiconductor silicon wafer and the target element is boron.

Figures 2, 3:
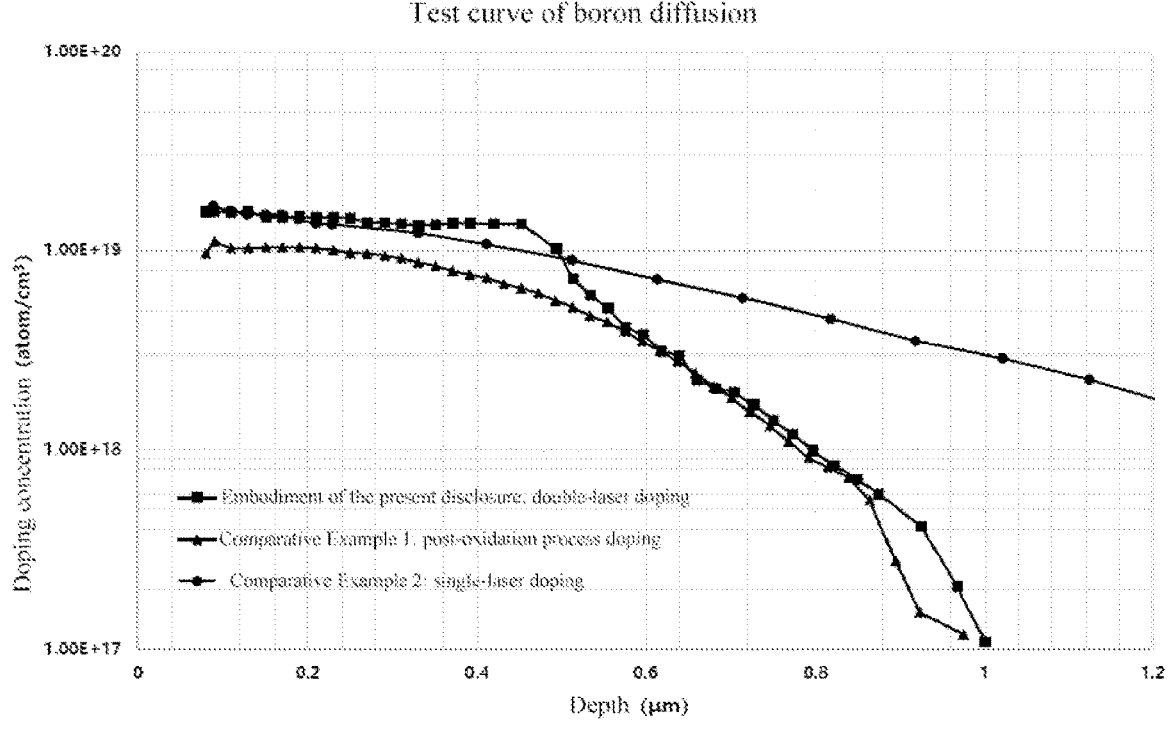
FIG. 2 shows a test curve of doping concentration of the emitter in FIG. 1, in which a target element is boron.
FIG. 3 is a schematic structural diagram after the emitter in FIG. 1 is coated with a doping reagent.

Within a unit volume, a rate of change $\Delta C_1$ between doping concentration of the second plane 13 and doping concentration of the first plane 12 and a rate of change $\Delta C_2$ between doping concentration of the third plane 14 and the doping concentration of the second plane 13 satisfy: $\Delta C_1 < \Delta C_2$. That is, as shown in FIG. 2, doping concentration of the first doped layer 15 and doping concentration of the second doped layer 16 change stepwise (that is, as shown in FIG. 2, a doping concentration curve of the target element in this embodiment is stepwise). Compared with the related art on the basis of the target element with an equal amount, in the embodiments of the present disclosure, the doping concentration of the target element in the first doped layer 15 is increased, which is conducive to improving conductivity of the first doped layer 15, enables the metal electrode to form good ohmic contact with the first doped layer 15, reduces contact resistance between the metal electrode and the first doped layer 15, thereby facilitating transmission of more majority carriers to the metal electrode, and increases a fill factor of the cell, thereby improving photoelectric conversion efficiency of the photovoltaic cell. In addition, upon comparison with the related art on the basis of same doping concentration of the first doped layer 15, $\Delta C_1 < \Delta C_2$ can reduce consumption of the doping reagent during the doping, thereby reducing manufacturing costs and a manufacturing cycle of the photovoltaic cell while ensuring stable operation of the photovoltaic cell.

The rate of change $\Delta C_1$ between the doping concentration of the second plane 13 and the doping concentration of the first plane 12 satisfies: $\Delta C_1 \leq 15\%$. If $\Delta C_1$ is greater than 15%, a difference between the doping concentration of the second plane 13 and the doping concentration of the first plane 12 is relatively large. During subsequent sintering of the doped electrode, the target element diffuses along a thickness direction of the substrate 1 to a direction close to the second plane 12 under the action of a high temperature, such that the doping concentration of the first plane 12 is reduced, thereby affecting ohmic contact between the sintered metal electrode and the first doped layer 15. Therefore, $\Delta C_1 \leq 15\%$ reduces a decrease rate of the doping concentration of the first doped layer 15 along the thickness direction, thereby reducing an influence of the subsequent sintering on the doping concentration of the first doped layer 15, such that the sintered metal electrode forms good ohmic contact with the first doped layer 15, thereby further improving the photoelectric conversion efficiency of the photovoltaic cell.

The rate of change $\Delta C_2$ between the doping concentration of the third plane 14 and the doping concentration of the second plane 13 satisfies: $\Delta C_2 \leq 30\%$. If $\Delta C_2$ is greater than 30%, a difference between the doping concentration of the third plane 14 and the doping concentration of the second plane 13 is relatively large. During subsequent sintering of the doped electrode, the target element in the first doped layer 15 diffuses along the thickness direction of the substrate 1 to a direction close to the third plane 14 under the action of a high temperature, such that the doping concentration of the first plane 15 is reduced, thereby affecting ohmic contact between the sintered metal electrode and the first doped layer 15. Therefore, $\Delta C_2 \leq 30\%$ further reduces the influence of the subsequent sintering on the doping concentration of the first doped layer 15, thereby further improving the photoelectric conversion efficiency of the photovoltaic cell.

In addition, within a unit volume, a rate of change $\Delta C_3$ between doping concentration at a first position of the second plane 13 and doping concentration at a second position of the second plane 13 satisfies: $\Delta C_3 \leq 25\%$. In other words, concentration difference of doping concentration at any two positions on the second plane satisfies: $\Delta C_3 \leq 25\%$. If $\Delta C_3 > 25\%$, during the subsequent sintering, at the first position with high doping concentration, the doping concentration of the first plane 12 at the first position changes less (that is, the concentration is reduced less). That is, the doping concentration of the first doped layer 15 at the first position changes less. At the second position with low doping concentration, the doping concentration of the first plane 12 at the second position changes more (that is, the concentration is reduced more). That is, the doping concentration of the first doped layer 15 at the second position changes more. As a result, contact resistance of connection between the sintered metal electrode and the emitter at the second position with low doping concentration is higher. Therefore, $\Delta C_3 \leq 25\%$ improves consistency of the doping concentration of the second plane 13, thereby reducing a risk of low local doping concentration of the first doped layer 15 after sintering, so as to further reduce the contact resistance of the connection between the metal electrode and the emitter, and improve consistency of the contact resistance of the connection between the metal electrode and the emitter, thereby improving operation stability of the emitter and metal electrode.

For example, as shown in FIG. 1, a distance H1 between the second plane 13 and the first plane 12 satisfies: 0.25 μm≤H1≤0.40 μm, and a distance H2 between the third plane 14 and the first plane 12 satisfies: 0.5 μm≤H2≤0.7 μm. In some embodiments, 0.30 μm≤H1≤0.35 μm.

If H1 and H2 are smaller (that is, H1<0.25 μm, and H2<0.5 μm), causing thicknesses of the first doped layer 15 and the second doped layer 16 to be smaller, during the doping, the target element of the first doped layer 15 can diffuse to the second doped layer 16 within a short time, which is not conducive to controlling the doping concentration of the first doped layer 15 and the second doped layer 16. If H1 and H2 are larger (that is, H1>0.40 μm, and H2>0.7 μm), the thicknesses of the first doped layer 15 and the second doped layer 16 are larger, the target element diffuses more slowly in the first doped layer 15 and the second doped layer 16 and has a longer manufacturing cycle while it is not conducive to controlling the thicknesses of the first doped layer 15 and the second doped layer 16. Therefore, 0.25 μm≤H1≤0.40 μm and 0.5 μm≤H2≤0.7 μm can shorten a doping cycle while reducing doping difficulty and ensuring consistency between the doping concentration of the first doped layer 15 and the doping concentration of the second doped layer 16.

For the above photovoltaic cell, as shown in FIG. 2 to FIG. 6, according to a second aspect of the present disclosure, a method for manufacturing a photovoltaic cell is provided, including: doping a target element into the substrate 1 to form the emitter; and manufacturing the passivation layer 11 on the first plane 12 of the emitter.

A manner of doping the target element includes, but not limited to, high-temperature doping, post-oxidation doping, laser doping, and the like. Laser doping is adopted in the present disclosure, so as to control a doping depth.

For example, the doping a target element into the substrate 1 includes: coating the first plane 12 with a doping reagent 2 containing the target element; directing a first laser 3 through the doping reagent 2 into the second plane 13 to diffuse the target element to the first doped layer 15 and the second doped layer 16; and directing a second laser 4 through the doping reagent 2 into the third plane 14 to diffuse the target element of the second doped layer 16 to the first doped layer 15.

In this embodiment, first, the first laser 3 is incident on the second plane 13, such that the target element is driven by the first laser 3 to enter the first doped layer 15 and diffuse to the second doped layer 16. In this case, the doping concentration of the first doped layer 15 varies greatly. That is, the doping concentration of the first doped layer 15 has poor consistency. The second laser 4 is incident on the third plane 14, such that the target element in the second doped layer 16 diffuses reversely to the first doped layer 15 to increase the concentration of the first doped layer 15 and diffuse the target element at a position with higher doping concentration inside the first doped layer 15 to a position with lower doping concentration, thereby improving the consistency of the doping concentration of the first doped layer 15. The target element is first doped into the first doped layer 15 and the second doped layer 16 by the first laser 3, and then the doping concentration of the first doped layer 15 and the second doped layer 16 is adjusted by the second laser 4, which simplifies the doping process of the emitter, thereby reducing a doping cycle and doping costs of the emitter. By use of laser doping, a risk of a decrease in the lifetime of the minority carriers caused by entry of impurities into the substrate 1 from a surface of the substrate 1 during the doping is reduced, thereby improving electrical properties of the photovoltaic cell.

For example, when the first laser 3 is incident on the second plane 13, the first laser 3 can generate a high temperature on the second plane 13, such that the target element near the second plane 13 diffuses towards a direction away from the second plane 13 (that is, diffuses towards a direction close to the first plane 12 and a direction close to the third plane 14). When the second laser 4 is incident on the third plane 14, the second laser 4 can generate a high temperature on the third plane 14, such that the target element near the third plane 14 diffuses toward a direction away from the third plane 14 (that is, diffuses towards a direction close to the first plane 12).

In this embodiment, local high temperatures generated by the first laser 3 and the second laser 4 drive the diffusion of the target element, which simplifies a doping manner of the emitter, thereby reducing doping costs of the emitter. At the same time, a diffusion rate of the target element is increased, thereby reducing a manufacturing cycle of the emitter.

A wavelength L1 of the first laser 3 satisfies: 300 nm≤L1≤400 nm, a wavelength L2 of the second laser 4 satisfies: 400 nm≤L2≤550 nm, and L1<L2. For example, L1=300 nm, 350 nm, or 390 nm, and L2=400 nm, 450 nm, or 500 nm.

In this embodiment, the wavelength of the first laser 3 is less than the wavelength of the second laser 4, such that a depth of the first laser 3 entering the emitter is less than a depth of the second laser 4 entering the emitter, which reduces a risk of failure of the second laser 4 caused by the depth of the second laser 4 entering the emitter being less than the depth of the first laser 3 entering the emitter, thereby improving operation stability of the first laser 3 and the second laser 4. 300 nm≤L1≤400 nm and 400 nm≤L2≤550 nm facilitate the first laser 3 to enter the preset second plane 13 and the second laser 4 to enter the preset third plane 14, so as to facilitate the control over the doping concentration of the emitter.

In addition, energy density W1 of the first laser 3 satisfies: 0.4 $J/cm^2$≤W1≤1.5 $J/cm^2$, and energy density W2 of the second laser 4 satisfies: 0.6 $J/cm^2$≤W2≤1.8 $J/cm^2$.

If the energy density of the first laser 3 is lower (i.e., W1<0.4 $J/cm^2$) and the energy density of the second laser 4 is lower (i.e., W2<0.6 $J/cm^2$), heat generated by the first laser 3 on the second plane 13 and heat generated by the second laser 4 on the third plane 14 are less, which reduces a diffusion rate of the target element. After the heat dissipates, the doping concentration of the first doped layer 15 and the second doped layer 16 changes less. If the energy density of the first laser 3 is higher (i.e., W1>1.5 $J/cm^2$) and the energy density of the second laser 4 is higher (i.e., W2>1.8 $J/cm^2$), the heat generated by the first laser 3 on the second plane 13 and the heat generated by the second laser 4 on the third plane 14 are more, such that the diffusion rate of the target element is higher. After the heat dissipates, the doping concentration of the first doped layer 15 and the second doped layer 16 changes more. Therefore, 0.4 $J/cm^2$≤W1≤1.5 $J/cm^2$ and 0.6 $J/cm^2$≤W2≤1.8 $J/cm^2$ can facilitate the control over the changes in the doping concentration before and after laser irradiation, thereby facilitating the realization of the consistency between the doping concentration of the first doped layer 15 and the second doped layer 16.

In any one of the above embodiments, the first laser 3 and the second laser 4 can be emitted by a same laser emitter, to simplify operations during the manufacturing, and can also be emitted by different laser emitters, so as to adjust parameters such as the wavelengths and the energy density of the first laser 3 and the second laser 4. In addition, the laser emitter can emit more than three laser of different wavelengths, such that the laser emitter can dope the target element to doped layers with different depths.

The doped layers may further include a third doped layer (not shown in the figure), a fourth doped layer (not shown in the figure), a fifth doped layer (not shown in the figure), and the like. A number of the doped layers is not limited in the present disclosure. Correspondingly, the laser may further include a third laser (not shown in the figure), a fourth laser (not shown in the figure), a fifth laser, and the like with different wavelengths.

To sum up, as shown in FIG. 6, the manufacturing method for the photovoltaic cell is as follows.

The surface of the substrate 1 is textured, such that an antireflection texture is formed on the surface of the substrate 1, thereby reducing light reflectivity of the surface of the substrate 1, so as to increase a utilization rate of solar energy by the photovoltaic cell and then improve conversion efficiency of the photovoltaic cell.

As shown in FIG. 3, the surface of the substrate 1 is coated with a doping reagent 2 containing the target element.

Figure 4:
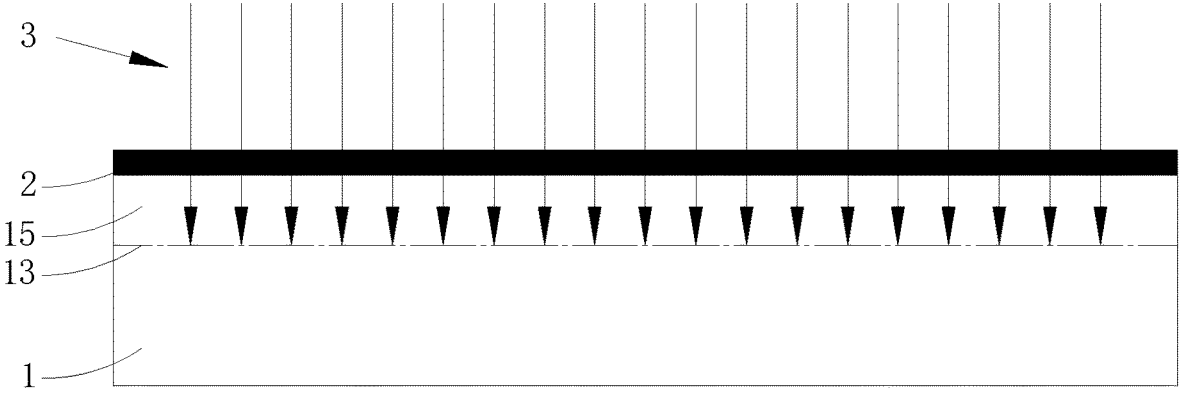
FIG. 4 is a schematic diagram showing that the emitter in FIG. 3 is irradiated by first laser.

As shown in FIG. 4, the first laser 3 passes through the doping reagent 2 and the first plane 12 into the second plane 13, and generates a local high temperature on the second plane 13. In this case, driven by the first laser 3 and the local high temperature generated by the first laser 3, the target element in the doping reagent 2 diffuses to the first doped layer 15 and the second doped layer 16.

Figure 5:
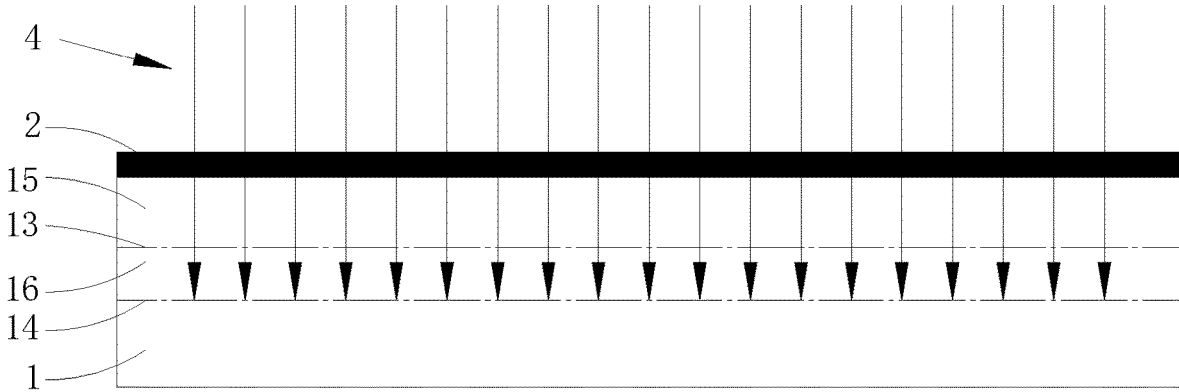
FIG. 5 is a schematic diagram showing that the emitter in FIG. 4 is irradiated by second laser.

As shown in FIG. 5, the second laser 4 passes through the doping reagent 2, the first plane 12, and the second plane 13 into the third plane 14, and generates a local high temperature on the third plane 14. In this case, driven by the local high temperature generated by the second laser 4, the target element in the second doped layer 16 diffuses to the first doped layer 15, so as to increase the doping concentration of the first doped layer 15.

The remaining doping reagent 2 is removed.

A back surface of the substrate 1 away from the emitter is polished along a thickness direction of the substrate 1.

The passivation layer 11 is manufactured on a surface of the emitter, so as to reduce activity of the surface of the substrate 1, increase a cleaning procedure for the surface, and reduce a risk of formation of a recombination center caused by introduction of impurities from the surface, thereby reducing a recombination rate of electrons and minority carriers and keeping the lifetime of effective minority carriers of the photovoltaic cell at a relatively high level, such that the photovoltaic cell obtains a higher open-circuit voltage and a higher short-circuit voltage, which effectively improves output characteristics of the photovoltaic cell, thereby improving the conversion efficiency of the photovoltaic cell.

Doping concentration of a double-laser doped emitter in the present disclosure, of an emitter doped by a post-oxidation process in Comparative Example 1, and of a single-laser doped emitter of Comparative Example 2 is detected, and after comparative analysis, a test curve of changes in the doping concentration as shown in FIG. 2 (the target element is boron) and a table of parameters of the photovoltaic cell as shown in Table 1 (specific data of Comparative Example 2 is not recorded in the table) are obtained.

TABLE 1

| | | Doping concentrations (atom/cm$^3$) | | | Solar cell parameter | |
|---|---|---|---|---|---|---|
| Embodiment | Doping curve | Depth 0.4 (μm) | Depth 0.5 (μm) | Depth 1.0 (μm) | Resistivity (mΩ · cm$^2$) | Fill factor (%) |
| 1 | Stepwise | 1.30E+19 | 1.00E+19 | <3E+17 | 1.3 | 83.5 |
| Comparative Example 1 | Conventional | 1.00E+19 | 6.00E+18 | <3E+17 | 1.6 | 83.2 |

As can be seen from FIG. 2 and Table 1, in Comparative Example 1 (doping is performed by a post-oxidation doping process), a difference between doping concentration of a first comparison plane (that is, at a depth of 0.4 μm in the table) and doping concentration of a second comparison plane (that is, at a depth of 0.5 μm in the table) is large, while in an embodiment of the present disclosure (i.e., Embodiment 1), a difference between doping concentration of a first detection plane (that is, at a depth of 0.4 μm in the table) and doping concentration of a second detection plane (that is, at a depth of 0.5 μm in the table) is small. Thus, compared with the post-oxidation doping process, consistency of the doping concentration of the double-laser doping in this embodiment of the present application is higher, such that the emitter has lower resistivity, which is conducive to the ohmic contact between the metal electrode and the emitter, and increases the fill factor of the photovoltaic cell, thereby improving the conversion efficiency of the photovoltaic cell.

The above are merely preferred embodiments of the present disclosure, and are not intended to limit the present disclosure. For those skilled in the art, the present disclosure may be subject to various modifications and changes. Any modification, equivalent replacement, improvement and the like within the spirit and principle of the present disclosure all fall within the protection scope of the present disclosure.

What is claimed is:

1. A photovoltaic cell, comprising:
a substrate (1) comprising an emitter disposed in the substrate, and
a passivation layer (11) stacked on a side of the emitter away from the substrate;
wherein the emitter comprises a first plane (12) and a second plane (13) laminated along a thickness direction of the emitter, and part of the emitter between the second plane (13) and the first plane (12) is a first doped layer (15); and
within a unit volume, a rate of change $\Delta C_1$ between doping concentration of the second plane (13) and doping concentration of the first plane (12) satisfies: $\Delta C_1 \leq 15\%$;
wherein a third plane (14) is provided on a side of the second plane (13) away from the first plane (12), and part of the emitter between the third plane (14) and the second plane (13) is a second doped layer (16); and a rate of change $\Delta C_2$ between doping concentration of the third plane (14) and the doping concentration of the second plane (13) satisfies: $\Delta C_2 \leq 30\%$;
wherein the rate of change $\Delta C_1$ between doping concentration of the second plane (13) and doping concentration of the first plane (12) and the rate of change $\Delta C_2$ between doping concentration of the third plane (14) and the doping concentration of the second plane (13) within a unit volume satisfy: $\Delta C_1 < \Delta C_2$;
wherein a distance H1 between the second plane (13) and the first plane (12) satisfies: 0.3 μm≤H1≤0.35 μm; and a distance H2 between the third plane (14) and the first plane (12) satisfies: 0.5 μm≤H2≤0.7 μm.

2. The photovoltaic cell according to claim 1, wherein the substrate (1) is made of a silicon substrate material, and the silicon substrate material includes one or more of monocrystalline silicon, polycrystalline silicon, amorphous silicon, and microcrystalline silicon.

3. The photovoltaic cell according to claim 1, wherein a target element in the first doped layer (15) and the second doped layer (16) includes, but is not limited to, nitrogen, phosphorus, arsenic, boron, aluminum, gallium, indium, thallium.

4. The photovoltaic cell according to claim 1, wherein, within a unit volume, a rate of change $\Delta C_3$ between doping concentration at a first position of the second plane (13).

5. The photovoltaic cell according to claim 1, wherein, doping concentration at a second position of the second plane (13) satisfies: $\Delta C_3 \leq 25\%$.

6. A method for manufacturing the photovoltaic cell according to claim 1, comprising:
doping a target element into the substrate (1) to form the emitter; and
manufacturing the passivation layer on the first plane (12) of the emitter.

7. The method according to claim 6, wherein a manner of doping the target element includes, but not limited to, high-temperature doping, post-oxidation doping, laser doping, and the like, Laser doping is adopted in the present disclosure, so as to control a doping depth.

8. The method according to claim 6, wherein a third plane (14) is provided on a side of the second plane (13) away from the first plane (12), and said doping a target element into the substrate (1) comprises:
coating the first plane (12) with a doping reagent (2) containing the target element;
directing a first laser (3) through the doping reagent (2) into the second plane (13) to diffuse the target element to the first doped layer (15) and the second doped layer (16); and
directing a second laser (4) through the doping reagent (2) into the third plane (14) to diffuse the target element of the second doped layer (16) to the first doped layer (15).

9. The method according to claim 8, wherein said directing a first laser (3) through the doping reagent (2) into the second plane (13) to diffuse the target element to the first doped layer (15) and the second doped layer (16) comprises:
directing the first laser (3) through the doping reagent (2) and the first plane (12) into the second plane (13), and generating a high temperature; and
driving the target element into the first doped layer (15) by the first laser (3) and further driving the target element to be diffused to the second doped layer (16) by the high temperature generated by the first laser (3).

10. The method according to claim 8, wherein the first laser (3) and the second laser (4) are emitted by different laser emitters, and one of the laser emitters emits more than three laser of different wavelengths.

11. The method according to claim 8, wherein said directing a second laser (4) through the doping reagent (2) into the third plane (14) to diffuse the target element of the second doped layer (16) to the first doped layer (15) comprises:
directing the second laser (4) through the doping reagent (2), the first plane (12), and the second plane (13) into the third plane (14), and generating a high temperature; and
driving the target element to be diffused to the first doped layer (15) by the high temperature generated by the second laser (4).

12. The method according to claim 8, wherein a wavelength L1 of the first laser (3) satisfies: 300 nm≤L1≤400 nm.

13. The method according to claim 12, wherein a wavelength L1 of the first laser (3) satisfies: 350 nm≤L1≤390 nm.

14. The method according to claim 8, wherein a wavelength L2 of the second laser (4) satisfies: 400 nm≤L2≤550 nm, and L1<L2.

15. The method according to claim 8, wherein energy density W1 of the first laser (3) satisfies: $0.4 \, J/cm^2 \leq W1 \leq 1.5 \, J/cm^2$.

16. The method according to claim 8, wherein energy density W2 of the second laser (4) satisfies: $0.6 \, J/cm^2 \leq W2 \leq 1.8 \, J/cm^2$.

17. The method according to claim 8, wherein, after said doping the target element, the method further comprises:

removing the doping reagent (2) remaining on the first plane (12).

* * * * *